(12) United States Patent
Tobe

(10) Patent No.: US 10,804,082 B2
(45) Date of Patent: Oct. 13, 2020

(54) SUBSTRATE PROCESSING APPARATUS, AND OPERATION METHOD FOR SUBSTRATE PROCESSING APPARATUS

(71) Applicant: Tokyo Electron Limited, Tokyo (JP)

(72) Inventor: Yasuhiro Tobe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 124 days.

(21) Appl. No.: 16/043,267

(22) Filed: Jul. 24, 2018

(65) Prior Publication Data

US 2019/0035609 A1    Jan. 31, 2019

(30) Foreign Application Priority Data

Jul. 25, 2017  (JP) .................. 2017-143697

(51) Int. Cl.
*H01J 37/32* (2006.01)
*H01L 21/67* (2006.01)
*H01L 21/683* (2006.01)

(52) U.S. Cl.
CPC .. *H01J 37/32724* (2013.01); *H01J 37/32522* (2013.01); *H01L 21/67017* (2013.01); *H01L 21/67109* (2013.01); *H01L 21/6831* (2013.01); *H01L 21/6833* (2013.01); *H01J 2237/002* (2013.01)

(58) Field of Classification Search
CPC .............. H01L 21/683; H01L 21/6831; H01L 21/67109; H01L 21/3065; H01J 37/32715; H01J 37/3299; H01J 37/32724; H01J 2237/002; H01J 37/32798

USPC ............................................................. 62/62
See application file for complete search history.

(56) References Cited

U.S. PATENT DOCUMENTS

| | | | |
|---|---|---|---|
| 8,453,468 B1 * | 6/2013 | Cowans | F25B 5/04 62/129 |
| 2009/0044752 A1 * | 2/2009 | Furuya | H01J 37/32724 118/723 E |
| 2010/0126666 A1 * | 5/2010 | Tandou | H01L 21/67248 156/345.27 |

FOREIGN PATENT DOCUMENTS

| | | |
|---|---|---|
| JP | 2011-119515 A | 6/2011 |
| JP | 2012-028811 A | 2/2012 |

* cited by examiner

*Primary Examiner* — Steve S Tanenbaum
(74) *Attorney, Agent, or Firm* — Pearne & Gordon LLP

(57) ABSTRACT

A substrate processing apparatus includes a chamber main body, a stage, a cooling device and a local loop. The stage is provided in an internal space of the chamber main body and a coolant path is formed in the stage. The cooling device is provided at an outside of the chamber main body. The cooling device includes a cooling loop having a compressor, a condenser, an expansion valve and an evaporator. The local loop is provided at a position closer to the chamber main body than the cooling device is. The local loop includes a receiver, a flow velocity controller and an evaporator pressure regulating valve. The receiver stores therein the coolant supplied from the cooling device. In this substrate processing apparatus, the coolant stored in the receiver can be circulated within the local loop.

8 Claims, 7 Drawing Sheets

SUBSTRATE PROCESSING APPARATUS, AND OPERATION METHOD FOR SUBSTRATE PROCESSING APPARATUS

CROSS-REFERENCE TO RELATED APPLICATION

This application claims the benefit of Japanese Patent Application No. 2017-143697 filed on Jul. 25, 2017, the entire disclosures of which are incorporated herein by reference.

TECHNICAL FIELD

The embodiments described herein pertain generally to a substrate processing apparatus and an operation method for the substrate processing apparatus.

BACKGROUND

In the manufacture of an electronic device such as a semiconductor device, a substrate processing apparatus is used to process a substrate. The substrate processing apparatus is generally equipped with a chamber main body and a stage. The stage is configured to support the substrate in an internal space of the chamber main body.

The substrate processing apparatus is equipped with a cooling device when a substrate is processed at a low temperature. As one kind of such a substrate processing apparatus having the cooling device, Patent Document 1 and Patent Document 2 describe direct expansion type cooling devices. In general, a direct expansion type cooling device includes a cooling loop having a compressor, a condenser, a pressure control valve and an evaporator. In the substrate processing apparatus, the stage has a coolant path formed therein, and this stage constitutes the evaporator. In the plasma processing apparatus equipped with the direct expansion type cooling device, a temperature of the substrate is controlled by adjusting a rotation number of the compressor.

Patent Document 1: Japanese Patent Laid-open Publication No. 2011-119515

Patent Document 2: Japanese Patent Laid-open Publication No. 2012-028811

Since the direct expansion type cooling device is of a large scale, the equipment other than the stage constituting the evaporator, that is, the compressor, the condenser and the pressure control valve may not be disposed in the vicinity of the chamber main body. By way of example, the equipment of the cooling device except the stage may be placed in a room on a floor different from a floor of a room in which the chamber main body is disposed. Accordingly, the equipment of the cooling device except the evaporator and the coolant path of the stage need to be connected via a long path. As a result, in the substrate processing apparatus equipped with the cooling device, the temperature of the substrate may not be controlled at a high speed. That is, responsiveness in temperature control over the substrate is low. Further, a large power is required to operate the compressor. In view of this background, it is required to improve the responsiveness in the temperature control over the substrate and reduce the power consumption of the cooling device.

SUMMARY

In one exemplary embodiment, there is provided a substrate processing apparatus. The substrate processing apparatus includes a chamber main body, a stage, a cooling device and a local loop. The stage is provided in an internal space of the chamber main body. The stage is configured to support a substrate placed thereon. A coolant path is formed in the stage. The cooling device is provided at an outside of the chamber main body. The cooling device includes a cooling loop having a compressor, a condenser, a first expansion valve and an evaporator. The local loop is provided at a position closer to the chamber main body than the cooling device is. The local loop includes a receiver, a flow velocity controller and an evaporator pressure regulating valve. The receiver is configured to store coolant therein. The flow velocity controller is connected between the receiver and the coolant path, and is configured to adjust a flow velocity of the coolant stored in the receiver and supply the coolant into the coolant path. The evaporator pressure regulating valve is connected between the coolant path and the receiver. The substrate processing apparatus further includes a first valve, a supply path, a second valve, a second expansion valve and a discharge path. The first valve is connected between the condenser and the first expansion valve within the cooling loop. The supply path has one end connected to the cooling loop between the first valve and the condenser and the other end connected to the receiver. The second valve is provided on the supply path. The second expansion valve is provided on the supply path between the second valve and the receiver. The discharge path has one end connected to the local loop at an output side of the evaporator pressure regulating valve and the other end connected to the cooling loop between the first expansion valve and the evaporator.

In the substrate processing apparatus, the coolant may be supplied from the cooling device into the receiver through the supply path, and this coolant may be stored in the receiver. The substrate processing apparatus is capable of circulating the coolant stored in the receiver within the local loop provided in the vicinity of the chamber main body. Accordingly, the substrate processing apparatus has high responsiveness in the temperature control over the substrate. Furthermore, in a period during which the coolant is being circulated within the local loop, a rotation speed of the compressor of the cooling device may be set to a low value. Thus, power consumption of the cooling device can be reduced.

The stage may have an inlet for the coolant into the coolant path and an outlet for the coolant from the coolant path, and the outlet may be provided at a position closer to a periphery of the stage than the inlet is. The coolant path may be inclined to approach a top surface of the stage as it goes from the inlet toward the outlet. A gas generated within the coolant path is collected in the vicinity of the outlet with high efficiency. Accordingly, the gas can be discharged from the coolant path efficiently.

The outlet is provided within the coolant path, and disposed at a position higher than a lower wall surface confining the coolant path in a vertical direction such that the gas in the coolant path is discharged preferentially to a liquid therein. The gas in the coolant path can be discharged preferentially to the liquid in the coolant path.

The substrate processing apparatus may be configured as a plasma processing apparatus. The stage comprises a base in which the coolant path is formed and an electrostatic chuck provided on the base. Further, the flow velocity controller may be a compressor. Moreover, the first valve and the second valve may be implemented by a single three-way valve.

In another exemplary embodiment, there is provided an operation method for the substrate processing apparatus as described above. This operation method includes (i) supplying the coolant into the receiver through the supply path from the cooling device; (ii) circulating the coolant within the local loop in a substrate processing period during which the substrate placed on the stage is being processed; and (iii) circulating the coolant within the cooling loop during the substrate processing period. The rotation number of the compressor of the cooling device in the substrate processing period is set to be lower than a rotation number of the compressor of the cooling device in a period during which the supplying of the coolant is performed.

In the above-stated operation method, the temperature of the substrate is adjusted by the circulation of the coolant within the local loop in a period during which the substrate is processed. Accordingly, the temperature control over the substrate can be performed with high responsiveness. In addition, the rotation number of the compressor in the period during which the substrate is being processed is set to be lower. Therefore, the power consumption of the cooling device is reduced.

The supplying of the coolant is performed in a period during which the substrate is being transferred between the internal space of the chamber main body and the outside of the chamber main body. The coolant is supplied into the receiver in the period when the substrate is not processed. Further, the coolant is replenished into the receiver without causing the substrate processing to be stopped. Accordingly, the throughput of the substrate processing can be improved.

According to the exemplary embodiments, as described above, the substrate processing apparatus can improve the responsiveness in the temperature control over the substrate, and the power consumption of the cooling device is reduced.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
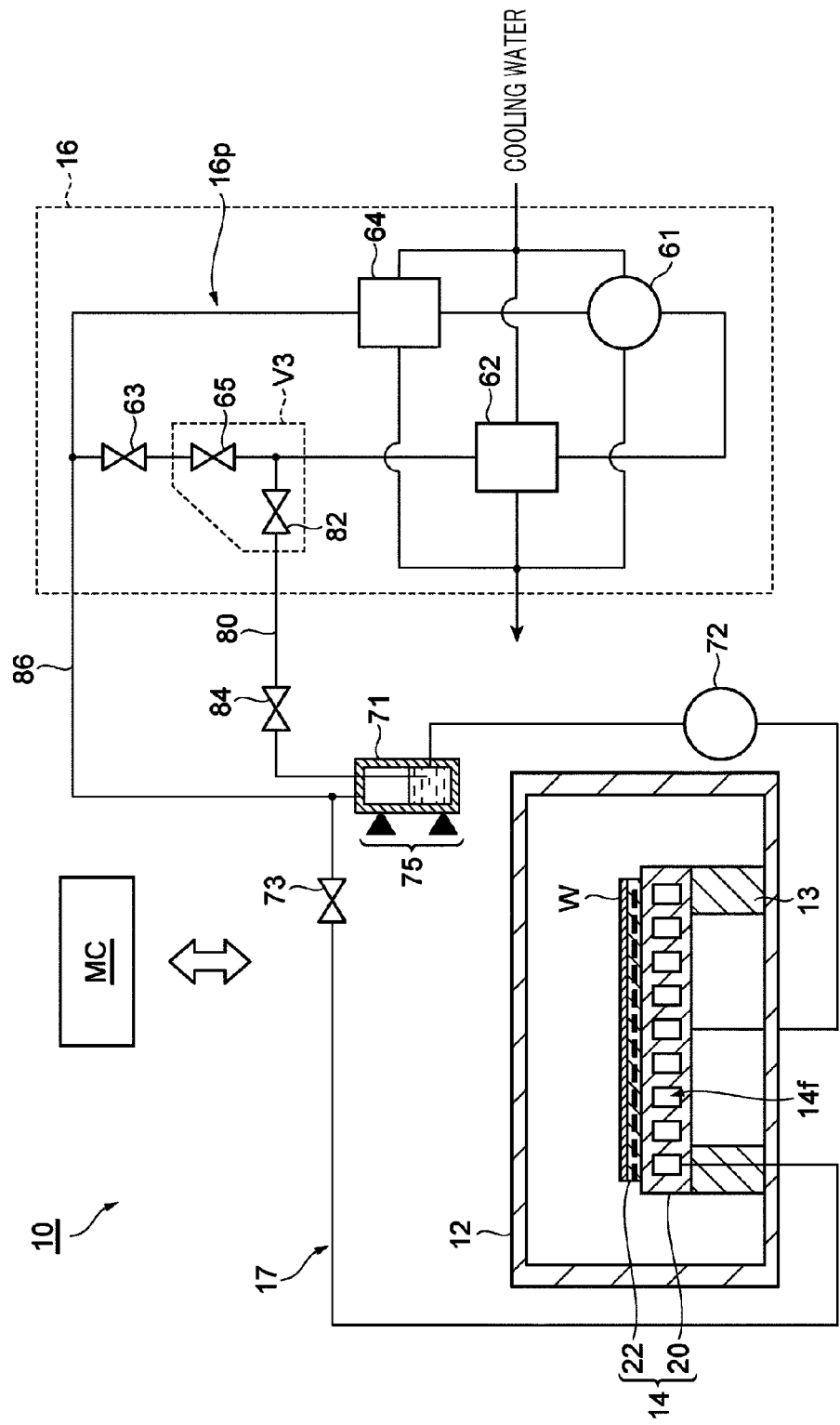
FIG. 1 is a diagram schematically illustrating a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described with reference to the accompanying drawings. In the various drawings, same or corresponding parts will be assigned same reference numerals.

Figure 2:
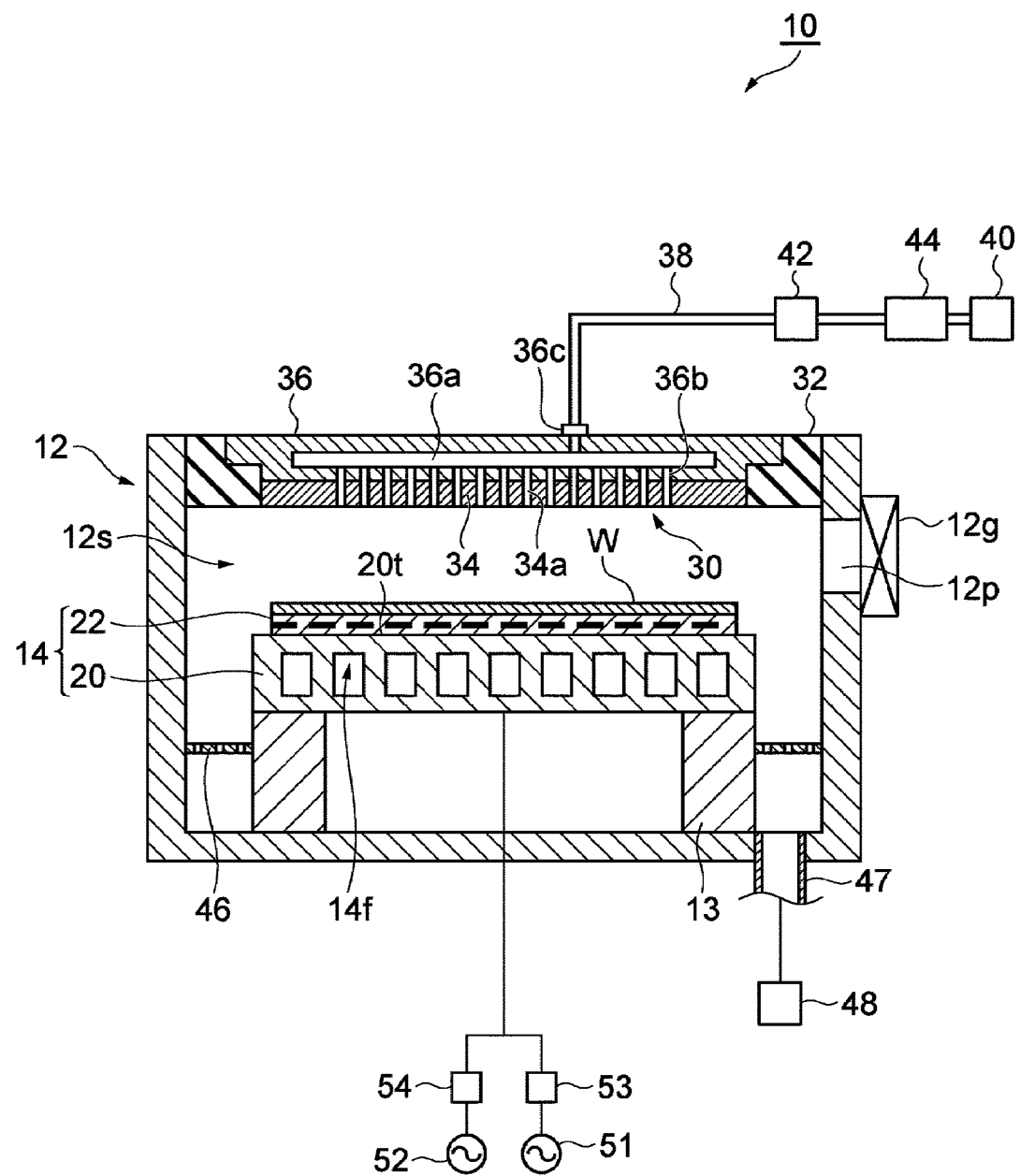
FIG. 2 is a diagram schematically illustrating a chamber main body, a power supply system and a gas supply system of the substrate processing apparatus according to the exemplary embodiment.

FIG. 1 is a diagram schematically illustrating a substrate processing apparatus according to an exemplary embodiment. A substrate processing apparatus 10 shown in FIG. 1 is equipped with a chamber main body 12, a stage 4, a cooling device 16 and a local loop 17. The substrate processing apparatus 10 is configured as a plasma processing apparatus. FIG. 2 is a diagram schematically illustrating the chamber main body, a power supply system and a gas supply system of the substrate processing apparatus. In the exemplary embodiment shown in FIG. 2, the substrate processing apparatus 10 is configured as a capacitively coupled plasma processing apparatus.

The chamber main body 12 has a substantially cylindrical shape and is made of, by way of non-limiting example, aluminum. The chamber main body 12 is connected to the ground potential. A film having plasma resistance is formed on an inner wall surface of the chamber main body 12, that is, on a wall surface confining an internal space 12s. For example, this film may be a film formed by anodic oxidation or a film made of ceramic such as an yttrium oxide film. Further, a passage 12p is formed at a sidewall of the chamber main body 12. When a substrate W is carried into or out of the internal space 12s, the substrate W passes through the passage 12p. A gate valve 12g is provided along the sidewall of the chamber main body 12 to open/close the passage 12p.

In the internal space 12s, a supporting member 13 is extended upwards from a bottom portion of the chamber main body 12. The supporting member 13 has a substantially cylindrical shape and is made of an insulating material such as quartz. The stage 14 is mounted on the supporting member 13 and supported by the supporting member 13. The stage 14 is configured to support the substrate W thereon in the internal space 12s. A coolant path 14f is formed within the stage 14. According to the exemplary embodiment, the coolant path 14f is extended in a spiral shape outwards from a center of the stage 14.

In the exemplary embodiment, the stage 14 includes a base 20 and an electrostatic chuck 22. In the exemplary embodiment, the coolant path 14f is formed within the base 20. The base 20 is made of a conductive material such as, but not limited to, aluminum and has a substantially disk shape. The base 20 constitutes a lower electrode.

The electrostatic chuck 22 is provided on a top surface 20t of the base 20. The top surface 20t of the base 20 may be a substantially flat surface extended in a direction orthogonal to the vertical direction. The electrostatic chuck 22 has a main body made of an insulator and a film-shaped electrode provided within the main body. The electrode of the electrostatic chuck 22 is electrically connected with a DC power supply. If a voltage is applied from the DC power supply to the electrode of the electrostatic chuck 22, an electrostatic attractive force is generated between the electrostatic chuck 22 and the substrate W placed on the electrostatic chuck 22. The substrate W is attracted to and held by the electrostatic chuck 22 with the generated electrostatic attractive force. Further, in the substrate processing apparatus 10, there may be provided a gas supply line through which a heat transfer gas (e.g., a He gas) from a gas supply mechanism is supplied to a gap between the electrostatic chuck 22 and a rear surface (bottom surface) of the substrate W. Further, a focus ring may be disposed to surround an edge of the electrostatic chuck 22 and an edge of the substrate W. The focus ring may be made of, by way of example, but not limitation, a silicon-containing material.

According to the exemplary embodiment, the substrate processing apparatus 10 is further equipped with an upper electrode 30. The upper electrode 30 is provided above the stage 14. The upper electrode 30 closes a top opening of the chamber main body 12 along with a member 32. The member 32 has insulation property. The upper electrode 30 is supported at a top portion of the chamber main body 12 with the member 32 therebetween. In case that a first high frequency power supply 51 is electrically connected to the base 20 as will be described later, the upper electrode 30 is connected to the ground potential.

The upper electrode 30 includes a ceiling plate 34 and a supporting body 36. A bottom surface of the ceiling plate 34 forms and confines the internal space 12s. The ceiling plate 34 is provided with a multiple number of gas discharge holes 34a. Each of the gas discharge holes 34a is formed through the ceiling plate 34 in a plate thickness direction (vertical direction). This ceiling plate 34 is made of, but not limited to, silicon. Alternatively, the ceiling plate 34 may have a structure in which a film having plasma resistance is formed on a surface of a base member made of aluminum. This film may be a film formed by anodic oxidation or a film made of ceramic such as yttrium oxide film.

The supporting body 36 is configured to support the ceiling plate 34 in a detachable manner, and is made of a conductor such as, but not limited to, aluminum. A gas diffusion space 36a is provided within the supporting body 36. Multiple gas holes 36b are extended downwards from the gas diffusion space 36a to communicate with the gas discharge holes 34a, respectively. Further, the supporting body 36 is provided with a gas inlet port 36c through which a gas is introduced into the gas diffusion space 36a, and a gas supply line 38 is connected to this gas inlet port 36c.

The gas supply line 38 is connected to a gas source group 40 via a valve group 42 and a flow rate controller group 44. The gas source group 40 includes a plurality of gas sources. The valve group 42 includes a plurality of valves, and the flow rate controller group 44 includes a plurality of flow rate controllers. Each of the flow rate controllers may be implemented by a mass flow controller or a pressure control type flow rate controller. Each of the gas sources belonging to the gas source group 40 is connected to the gas supply line 38 via a corresponding flow rate controller belonging to the flow rate controller group 44 and a corresponding valve belonging to the valve group 42.

A baffle plate 46 is provided between the supporting member 13 and the sidewall of the chamber main body 12. The baffle plate 46 may be made of, by way of example, an aluminum base member coated with ceramic such as yttrium oxide. The baffle plate 46 is provided with a plurality of through holes. Under the baffle plate 46, a gas exhaust line 47 is connected to the bottom portion of the chamber main body 12. The gas exhaust line 47 is connected to a gas exhaust device 48. The gas exhaust device 48 has a pressure controller such as an automatic pressure control valve and a vacuum pump such as a turbo molecular pump, and is capable of decompressing the internal space 12c.

According to the exemplary embodiment, the plasma processing apparatus 10 is further equipped with a first high frequency power supply 51. The first high frequency power supply 51 is configured to generate a first high frequency power for plasma generation. A frequency of the first high frequency power is in the range from 27 MHz to 100 MHz, for example, 60 MHz. The first high frequency power supply 51 is electrically connected to the base 20 via a matching device 53. The matching device 53 is equipped with a circuit configured to match an output impedance of the first high frequency power supply 51 and an input impedance at a load side (lower electrode side). Further, the first high frequency power supply 51 may be connected to the upper electrode 30 via the matching device 53.

In the exemplary embodiment, the substrate processing apparatus 10 may be further equipped with a second high frequency power supply 52. The second high frequency power supply 52 is configured to generate a second high frequency power for ion attraction into the substrate W. A frequency of the second high frequency power ranges from 400 kHz to 13.56 MHz, for example, 400 kHz. The second high frequency power supply 52 is electrically connected to the base 20 via a matching device 54. The matching device 54 is equipped with a circuit configured to match an output impedance of the second high frequency power supply 52 and the input impedance at the load side (lower electrode side).

The plasma processing apparatus 10 may further include a control unit MC. The control unit MC is implemented by a computer including a processor, a storage device, an input device, a display device, and so forth, and is configured to control the individual components of the plasma processing apparatus 10. To elaborate, the control unit MC executes a control program stored in the storage device and controls the individual components of the substrate processing apparatus 10 based on recipe data stored in the storage device. Accordingly, the substrate processing apparatus 10 performs a preset process based on the recipe data.

As depicted in FIG. 1, the cooling device 16 has a cooling loop 16p. The cooling loop 16p is composed of a compressor 61, a condenser 62, an expansion valve 63 (first expansion valve) and an evaporator 64. The compressor 61 is configured to compress a coolant supplied from the evaporator 64. The coolant compressed by the compressor 61 is supplied to the condenser 62. The condenser 62 is configured to condense the coolant supplied from the compressor 61. Cooling water is supplied into the condenser 62. In the condenser 62, the coolant is condensed through heat exchange between the cooling water and the coolant from the compressor 61. The coolant condensed by the condenser 62 is then supplied into the expansion valve 63 via a valve 65 (first valve). In the expansion valve 63, the coolant from the condenser 62 is decompressed. The coolant decompressed by the expansion valve 63 is then supplied into the evaporator 64. Further, the valve 65 may be an opening/closing valve. The valve 65 is opened when the coolant is circulated within the cooling loop 16p. Meanwhile, the valve 65 is closed when the coolant is not circulated within the cooling loop 16p.

The local loop 17 is provided at a closer position to the chamber main body 12 than the cooling device 16 is. The local loop 17 includes a receiver 71, a flow velocity controller 72 and an evaporator pressure regulating valve 73. The receiver 71 is a receptacle configured to store the coolant therein. The flow velocity controller 72 is connected between the receiver 71 and a coolant inlet to a coolant path 14i. The flow velocity controller 72 is configured to receive the coolant stored in the receiver 71, control a flow velocity of the received coolant and supply the coolant whose flow velocity is controlled into the coolant path 14f. As an example, the flow velocity controller 72 may be implemented by a compressor. The evaporator pressure regulating valve 73 is connected between a coolant outlet from the coolant path 14f and the receiver 71.

The local loop 17 is configured to cool the stage 14 (base 20) and the substrate W placed on the stage 14 by circulating the coolant stored in the receiver 71 within the local loop 17. A temperature of the stage 14 is increased as the flow velocity of the coolant outputted from the flow velocity controller 72 is increased, and is decreased as the flow velocity of the corresponding coolant is decreased. If the flow velocity controller 72 is the compressor, the temperature of the stage 14 is increased as a rotation number of the flow velocity controller 72 is increased, and is decreased as the rotation number of the flow velocity controller 72 is decreased.

The substrate processing apparatus 10 is further equipped with a supply path 80, a valve 82 (second valve), an expansion valve (second expansion valve) and a discharge path 86. One end of the supply path 80 is connected to a path of the cooling loop 16p between the compressor 62 and the valve 65. The supply path 80 is implemented by, by way of example, one or more pipelines. The valve 82 is provided on the supply path 80. The valve 82 may be an opening/closing valve. The valve 82 is opened when the coolant is supplied from the cooling device 16 to the receiver 71. The valve 82 is closed when the coolant is not supplied from the cooling device 16 to the receiver 71. The valve 82 and the aforementioned valve 65 are operated exclusively. That is, when the valve 82 is opened, the valve 65 is closed, whereas when the valve 82 is closed, the valve 65 is opened. The valve 82 and the valve 65 may be independent two-way valves. Alternatively, the valve 82 and the valve 65 may be implemented by a single three-way valve V3.

The expansion valve 84 is provided between the valve 82 and the receiver 71. The receiver 71 is equipped with a liquid amount measuring device 75. The liquid amount measuring device 75 is configured to acquire a measurement value indicating a liquid amount within the receiver 71. If it is determined from the measurement value of the liquid amount measuring device 75 that the coolant needs to be replenished into the receiver 71, the valve 82 and so forth are controlled by the control unit MC, and the coolant is supplied into the receiver 71 from the cooling device 16.

The discharge path 86 is implemented by one or more pipelines. One end of the discharge path 86 is connected to the local loop 17 at an output side of the evaporator pressure regulating valve 73. That is, the one end of the discharge path 86 is connected to a path of the local loop 17 between the evaporator pressure regulating valve 73 and the receiver 71. The other end of the discharge path 86 is connected to the path of the cooling loop 16p between the expansion valve 63 and the evaporator 64. A gas (coolant) from the evaporator pressure regulating valve 73 is discharged into the cooling loop 16p through the discharge path 86. Meanwhile, a liquid (coolant) from the evaporator pressure regulating valve 73 is returned back into the receiver 71.

In the substrate processing apparatus 10, the coolant can be supplied from the cooling device 16 into the receiver 71 through the supply path 80, and this coolant can be stored in the receiver 71. The substrate processing apparatus 10 is capable of circulating the coolant stored in the receiver 71 within the local loop 17 provided in the vicinity of the chamber main body 12. Accordingly, the substrate processing apparatus 10 has high responsiveness in the temperature control over the substrate W. Furthermore, in a period during which the coolant is being circulated within the local loop 17, a rotation speed of the compressor 61 of the cooling device 16 may be set to a low value. Thus, power consumption of the cooling device 16 can be reduced.

Figure 3:
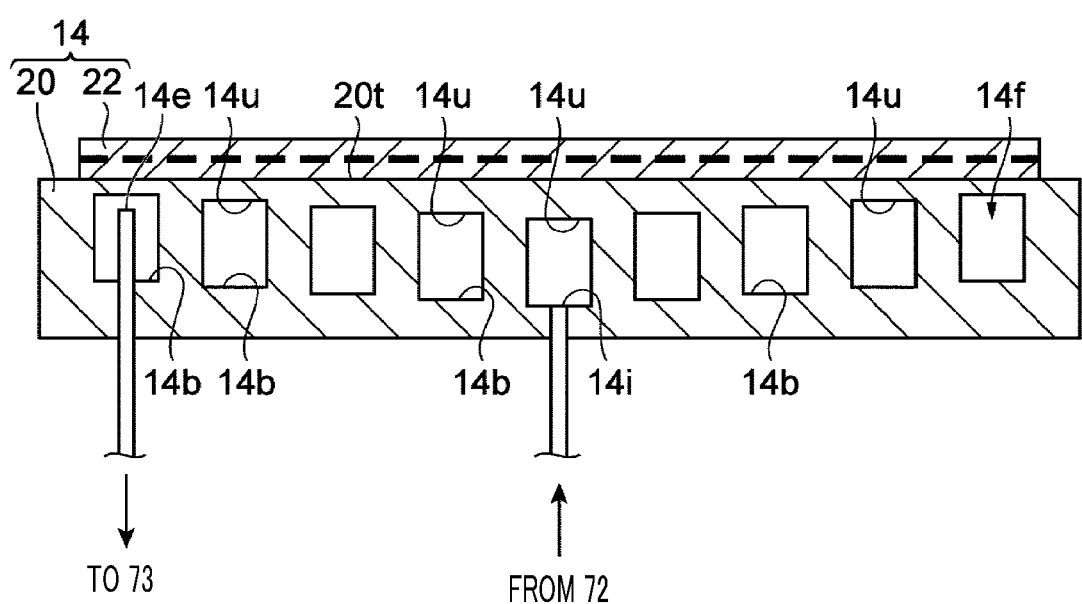
FIG. 3 is a diagram illustrating another example of a coolant path within a stage.
Figure 4:
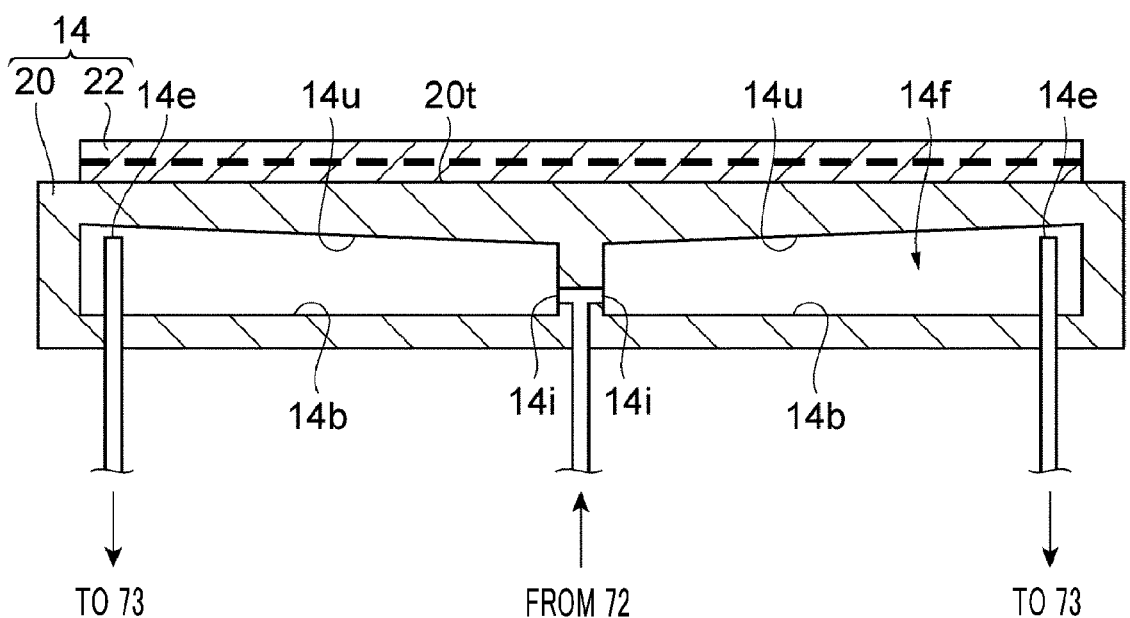
FIG. 4 is a diagram illustrating still another example of the coolant path within the stage.

Hereinafter, various examples of the coolant path 14f of the stage 14 will be explained. FIG. 3 and FIG. 4 are diagrams illustrating other examples of the coolant path of the stage. The coolant path 14f of the stage 14 shown in FIG. 3 is formed within the base 20 and extended in a spiral shape from a center of the stage 14 toward a periphery thereof. The stage 14 has an inlet 14i and an outlet 14e. The inlet 14i is an inlet for the coolant into the coolant path 14f. The outlet 14e is an outlet for the coolant from the coolant path 14f. The outlet 14e is provided closer to the periphery of the stage 14 than the inlet 14i is. The coolant path 14f of the stage 14 shown in FIG. 3 is inclined to approach a top surface of the stage 14 or the top surface 20t of the base 20 as it goes from the inlet 14i toward the outlet 14e. Further, as the coolant path 14f goes from the inlet 14i to the outlet 14e, an upper wall surface 14u, among wall surfaces forming the coolant path 14f, may be inclined to approach the top surface of the stage 14 or the top surface 20t of the base 20.

In the stage 14 depicted in FIG. 3, the outlet 14e is formed within the coolant path 14f and provided at a position higher than a lower wall surface 14b forming the coolant path 14f in the vertical direction in order to discharge the gas in the coolant path 14f preferentially to the liquid therein.

The coolant path 14f of the stage 14 illustrated in FIG. 4 is formed within the base 20. The coolant path 14f of the stage 14 depicted in FIG. 4 does not have a spiral shape but has a substantially circular plane shape when viewed from the vertical direction. An inlet 14i for the coolant into the coolant path 14f is connected to the coolant path 14f near the center of the stage 14. The stage 14 shown in FIG. 4 has multiple outlets 14e for the coolant from the coolant path 14f. The multiple outlets 14e are provided at positions closer to the periphery of the stage 14 than the inlet 14i is. The coolant path 14f of the stage 14 shown in FIG. 4 is also inclined to approach the top surface of the stage 14 or the top surface 20t of the base 20 as it goes from the inlet 14i toward the multiple outlets 14e. Further, as the coolant path 14f goes from the inlet 14i to the multiple outlets 14e, an upper wall surface 14u, among the wall surfaces forming the coolant path 14f, may be inclined to approach the top surface of the stage 14 or the top surface 20t of the base 20.

In the stage 14 depicted in FIG. 4, the multiple outlets 14e are formed within the coolant path 14f and provided at positions higher than a lower wall surface 14b forming the coolant path 14f in the vertical direction in order to discharge the gas in the coolant path 14f preferentially to the liquid therein.

According to the stage 14 shown in FIG. 3 and FIG. 4, the gas generated within the coolant path 14f is collected in the vicinity of the outlet(s) 14e with high efficiency. Accordingly, the gas can be discharged from the coolant path 14f efficiently. Further, the gas within the coolant path 14f can be discharged from the outlet(s) 14e preferentially to the liquid within the coolant path 14f.

Figure 5:
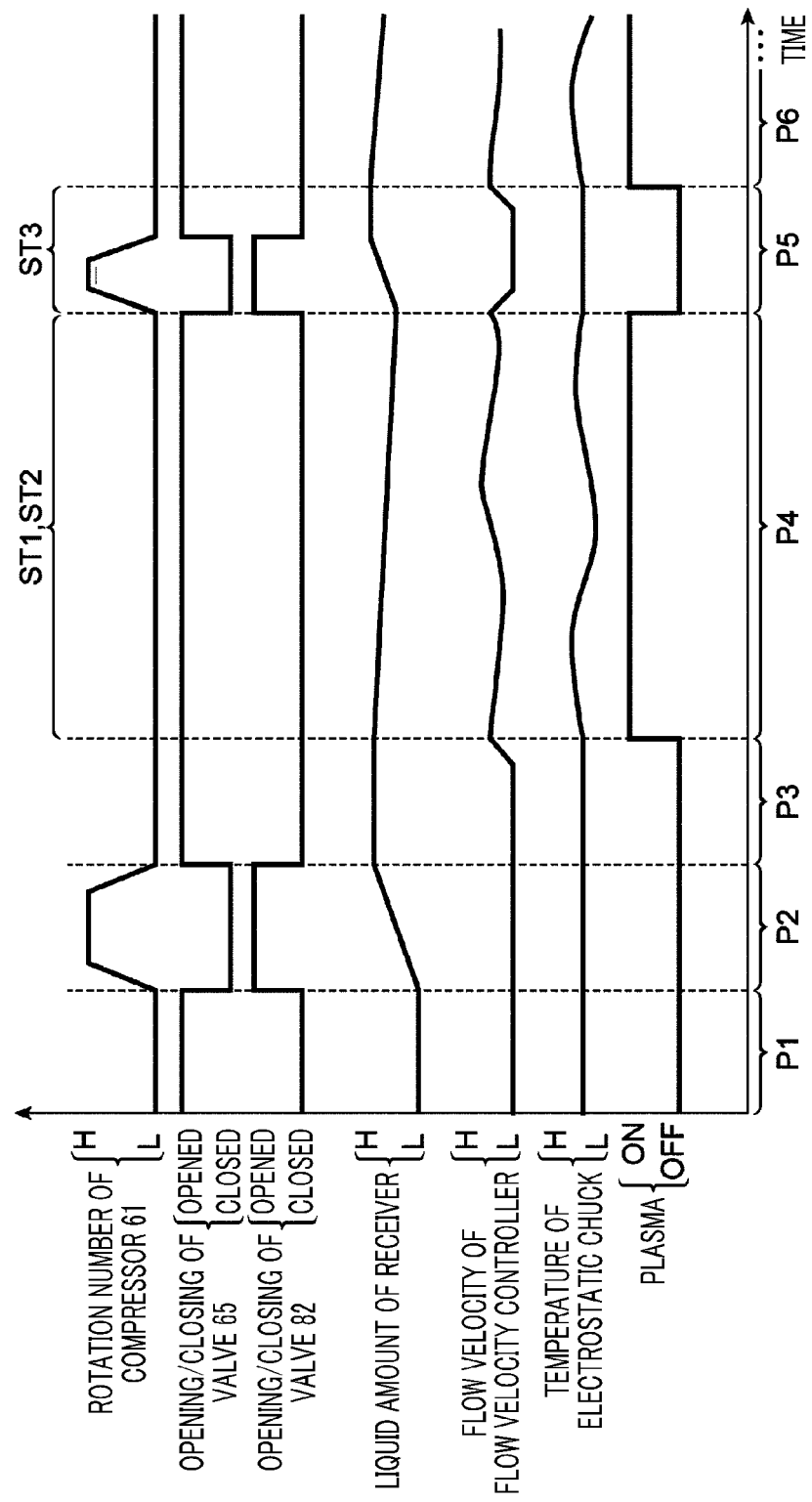
FIG. 5 is a timing chart regarding an operation method for the substrate processing apparatus according to the exemplary embodiment.

Now, an operation method for the substrate processing apparatus 10 according to the exemplary embodiment will be explained. FIG. 5 is a timing chart regarding the operation method for the substrate processing apparatus according to the exemplary embodiment. On the timing chart of FIG. 5, a horizontal axis represents time. Further, on the timing chart of FIG. 5, a vertical axis indicates the rotation number of the compressor 61, the opening/closing of the valve 65, the opening/closing of the valve 82, the liquid amount of the receiver, the flow velocity of the flow velocity controller (that is, the flow velocity of the coolant outputted from the receiver 72), a temperature of the electrostatic chuck and a plasma state. "H" regarding the rotation number of the compressor 61 implies that the rotation number of the compressor 61 is high, whereas "L" regarding the rotation number of the compressor 61 means that the rotation number of the compressor 61 is low. "H" regarding the liquid amount of the receiver 71 implies that the liquid amount of the receiver 71 is large, whereas "L" regarding the liquid amount of the receiver 71 means that the liquid amount of the receiver 71 is small. H" regarding the flow velocity of the flow velocity controller implies that the flow velocity of the coolant outputted from the flow velocity controller 72 is high, whereas "L" regarding the flow velocity of the flow velocity controller means that the flow velocity of the coolant outputted from the flow velocity controller 72 is low. "H" regarding the temperature of the electrostatic chuck implies that the temperature of the electrostatic chuck 22 is high, whereas "L" regarding the temperature of the electrostatic chuck means that the temperature of the electrostatic chuck 22 is low. Further, "ON" regarding the plasma state implies that plasma is being generated in the internal space 12s of the chamber main body 12, whereas "OFF" regarding the plasma state implies that the plasma is not being generated within the internal space 12s of the chamber main body 12. Moreover, in a period during which the plasma state is ON, the plasma is generated in the state that the substrate W is placed on the electrostatic chuck 22, so that the substrate is processed by the plasma. Further, in the operation method for the substrate processing apparatus 10 according to the exemplary embodiment, the degree of openness of the expansion valve 63, the degree of openness of the expansion valve 84 and the degree of openness of the evaporator pressure regulating valve 73 may be respectively fixed. Further, this operation method can be performed as the control unit MC controls the individual components of the substrate processing apparatus 10.

In the operation method shown in FIG. 5, the substrate processing apparatus 10 is in an idle operation state in a period P1. In the period P1, the valve 65 of the cooling device 16 is opened, and the rotation number of the compressor 61 is set to be of a low value. In the period P1, the valve 82 is closed. In the idle operation state of the period P1, the coolant is circulated within the cooling loop 16p of the cooling device 16. Further, in the idle operation state of the period P1, the rotation number of the compressor 61 is set to be of a low value. Accordingly, the power consumption of the cooling device 16 is reduced.

In a subsequent period P2, the coolant is stored in the receiver 71. In the period P2, the valve 65 is closed, and the valve 82 is opened. Further, in the period P2, the rotation number of the compressor 61 is set to be of a high value. In the period P2, the coolant is supplied into the receiver 71 from the cooling device 16 through the supply path 80. The coolant supplied into the receiver 71 is stored in the receiver 71.

In a subsequent period P3, the substrate processing apparatus 10 is in the idle operation state. In the period P3, however, the substrate to be processed in a subsequent period P4 is transferred into the internal space 12s and placed on the electrostatic chuck 22. In the period P3, the valve 65 of the cooling device 16 is opened, and the rotation number of the compressor 61 is set to be of a low value. In the idle operation state of the period P3, the coolant is circulated within the cooling loop 16p of the cooling device 16. Further, in the idle operation state of the period P3, the rotation number of the compressor 61 is set to be of a low value. Accordingly, the power consumption of the cooling device 16 is reduced.

The following period P4 is a substrate processing period. In the period P4, the substrate W is processed in the internal space 12s of the substrate processing apparatus 10. In the period P4, the rotation number of the compressor 61 is set to be low, and the valve 65 is opened while the valve 82 is closed. In the period P4, the coolant is circulated within the local loop 17 (process ST1). Further, in the period P4, the coolant is also circulated within the cooling loop 16p (process ST2). In the period P4, the velocity of the coolant supplied into the coolant path 14f is controlled by the flow velocity controller 72. The velocity of the coolant is adjusted such that the temperature of the electrostatic chuck 22 and, further, the temperature of the substrate W is equal to or approaches a set temperature. By way of example, the velocity of the coolant is adjusted such that a difference between the set temperature and the temperature of the electrostatic chuck 22 or the temperature of the substrate W measured by a temperature sensor is reduced. In the period P4, plasma is generated in the internal space 12s of the chamber main body 12. In the substrate processing apparatus 10 according to the exemplary embodiment, a processing gas is supplied into the internal space 12s, the internal space 12s is decompressed to a set pressure, and the processing gas is excited as the first high frequency power is supplied. Further, when necessary, the second high frequency power may be supplied to the base 20. In the period P4, the substrate W is processed by ions or radicals in the plasma generated in the internal space 12s. In the period P4, the coolant (gas) evaporated in the coolant path 141 is returned back into the cooling loop 16p through the discharge path 86. Accordingly, in the period P4, the amount of the coolant within the receiver 71 gradually decreases.

In a subsequent period P5, the coolant is supplied into the receiver 71 (process ST3). That is, the coolant is replenished into the receiver 71 in the period P5. In the period P5, the valve 65 is closed, whereas the valve 82 is opened. Further, in the period P5, the rotation number of the compressor 61 is set to be high. In the period P5, the coolant is supplied into the receiver 71 from the cooling device 16 through the supply path 80. Accordingly, in the period P5, the amount of the coolant within the receiver 71 increases.

To process a next substrate W in a period P6, in the period P5, the substrate W processed in the period P4 is carried out of the internal space 12s of the chamber main body 12. In the period P5, the next substrate W is carried into the internal space 12s of the chamber main body 12 and placed on the electrostatic chuck 22. That is, the period P5 is a time period during which the substrate is transferred between the internal space 12s and the outside of the chamber main body 12. In the operation method, the coolant is supplied into the receiver 71 during this period P5. Further, in the operation method, the processing upon the corresponding next substrate W is performed in the period P6.

In the above-stated operation method, the temperature of the substrate W is adjusted by the circulation of the coolant within the local loop 17 in a period (e.g., the period P4) during which the substrate W is processed. Accordingly, the temperature control over the substrate W can be performed with high responsiveness. In addition, the rotation number of the compressor 61 in the period (e.g., the period P4) during which the substrate W is processed is set to be lower than the rotation number of the compressor 61 in a period (e.g., the period P5) during which the coolant is supplied into the receiver 71 from the cooling device 16. Therefore, the power consumption of the cooling device 16 is reduced.

Furthermore, in the above-described operation method, the coolant is supplied into the receiver 71 from the cooling device 16 in a period (e.g., the period P5) during which the substrate is transferred. That is, the coolant is supplied into the receiver 71 in the period when the substrate is not processed. Accordingly, the coolant is replenished into the receiver 71 without causing the substrate processing to be stopped. Therefore, throughput of the substrate processing can be improved. Besides, if the measurement value of the liquid amount measuring device 75 falls below a threshold value, the coolant may be supplied to the receiver 71 from the cooling device 16 even when the substrate processing is being performed.

So far, the various exemplary embodiments and examples have been described. However, the exemplary embodiments and examples are not limiting and can be modified in various ways. By way of example, though the above-described substrate processing apparatus 10 is the capacitively coupled plasma processing apparatus, various other types of plasma processing apparatuses such as an inductively coupled plasma processing apparatus and a plasma processing apparatus configured to generate plasma by using a surface wave such as a microwave may be used. Furthermore, the substrate processing apparatus may be an apparatus configured to perform a certain surface processing.

Figure 6A:
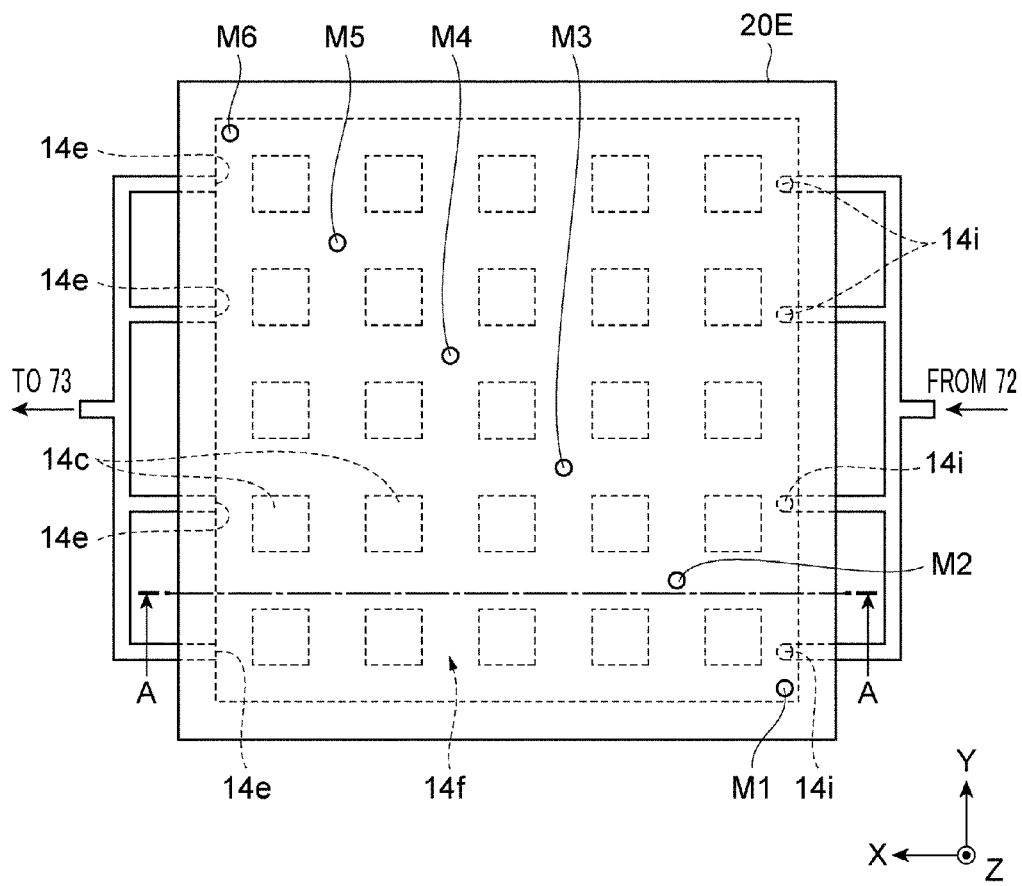
FIG. 6A is a plan view illustrating a base of a stage of a substrate processing apparatus used in an experiment.
Figure 6B:
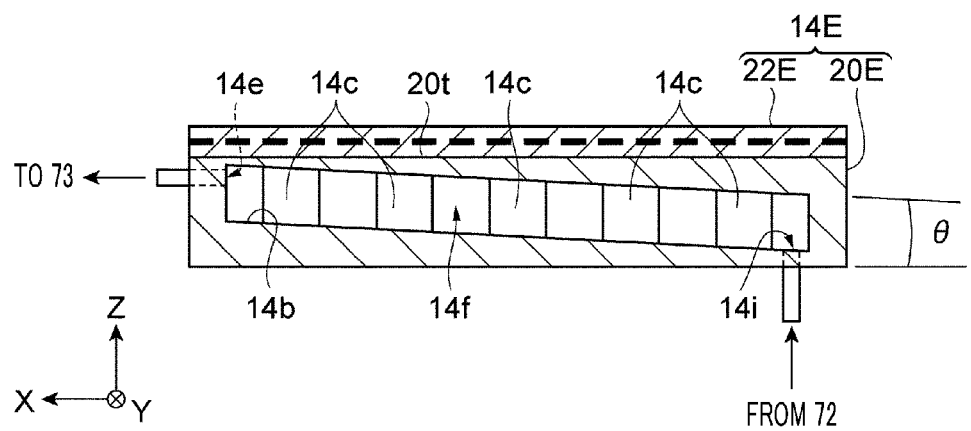
FIG. 6B is a cross sectional view of the stage taken along a line A-A of FIG. 6A.

Now, an experiment conducted to evaluate the substrate processing apparatus 10 will be explained. FIG. 6A is a plan view illustrating a base of a stage of a substrate processing apparatus used in the experiment, and FIG. 6B is a cross sectional view of the stage taken along a line A-A of FIG. 6A. The substrate processing apparatus used in the experiment was different from the substrate processing apparatus 10 only in that it had a stage 14E shown in FIG. 6A and FIG. 6B instead of the stage 14.

The stage 14E has a base 20E and an electrostatic chuck 22E. Each of the base 20E and the electrostatic chuck 22E has a rectangular plane shape when viewed from the vertical direction (Z direction). The base 20E is provided with a coolant path 14f having a rectangular plane shape when viewed from the Z direction. Multiple columns 14c are arranged within the coolant path 14f at a regular interval along the X and Y directions. The X and Y directions are orthogonal to each other and perpendicular to the Z direction. In the stage 14E, four inlets 14i are provided at one side of the coolant path 14f in the X direction, and four outlets 14e are provided at the other side thereof. The outlets 14e are provided at positions higher than a lower wall surface 14b of the coolant path 14f in the Z direction.

In the experiment, temperatures of six measurement points M1 to M6 within a top surface 20t of the base 20E were measured under each of the following first to sixth conditions. Further, in the first to sixth conditions, θ denotes an angle formed by the flow path 14f with respect to the horizontal direction and indicates an inclination of the coolant path 14f. The θ having a positive value implies that the flow path 14f is inclined to approach the top surface 20t of the base 20E as it goes from the inlet 14i to the outlet 14e along the X direction. Further, in the first to sixth conditions, a heat input denotes heat input transferred from the plasma to the stage 14, and a unit thereof is watt.

Figure 7:
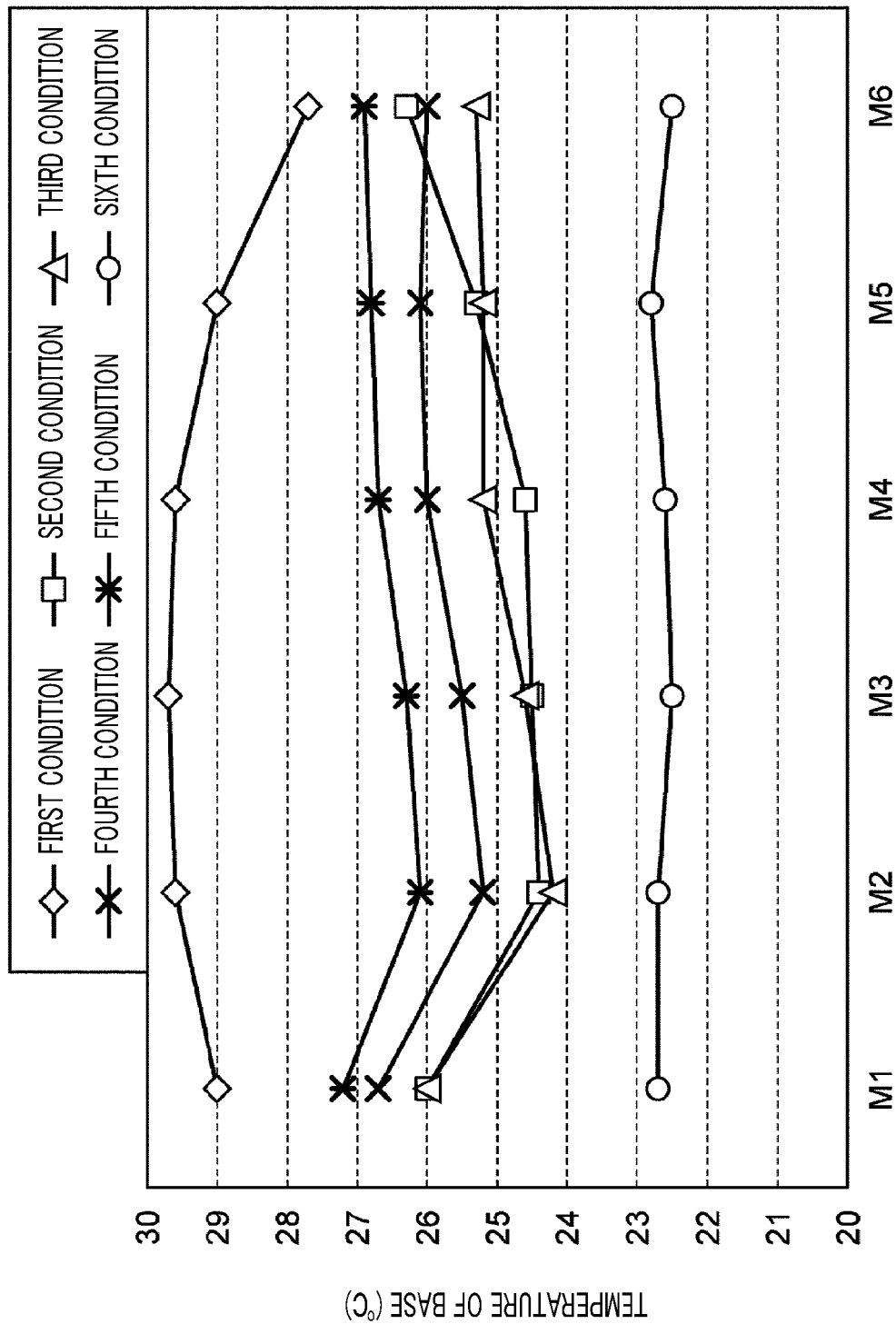
FIG. 7 is a graph showing an experiment result.

<First condition>
θ: 0°
Heat input: 1050 W
Rotation number of flow velocity controller 72 (compressor): 0 rpm <Second condition>
θ: 5°
Heat input: 1050 W
Rotation number of flow velocity controller 72 (compressor): 0 rpm <Third condition>
θ: 0°
Heat input: 1050 W
Rotation number of flow velocity controller 72 (compressor): 1000 rpm <Fourth condition>
θ: 0°
Heat input: 1050 W
Rotation number of flow velocity controller 72 (compressor): 2000 rpm <Fifth condition>
θ: 0°
Heat input: 1050 W
Rotation number of flow velocity controller 72 (compressor): 4000 rpm <Sixth condition>
θ: 0°
Heat input: 0 W
Rotation number of flow velocity controller 72 (compressor): 0 rpm FIG. 7 shows a result of the experiment. On a graph of FIG. 7, a horizontal axis indicates the measurement points M1 to M6, and a vertical axis represents the temperature of the base 20E at the individual measurement points. Since there was no heat input to the stage 14 in the sixth condition, the temperatures at the measurement points M1 to M6 were low and substantially equal as shown in FIG. 7 even when the coolant path 14f had no inclination and the rotation number of the flow velocity controller 72 was 0 rpm.

In the first condition, since there was heat input to the stage 14, the coolant path 14f had no inclination and the rotation number of the flow velocity controller 72 was 0 rpm, all the temperatures at the measurement points M1 to M6 were relatively high. In the second condition, although there was heat input to the stage 14 and the rotation number of the flow velocity controller 72 was 0 rpm, all the temperatures at the measurement points M1 to M6 were found to be lower than the temperatures at the measurement points M1 to M6 in the first condition since the coolant path 14f was inclined. In the second condition, however, the temperature at the measurement point M6 was relatively high. It is deemed to be because air bubbles may stay in the coolant path 14f in the vicinity of the measurement point M6, that is, in the vicinity of the outlet 14e.

In each of the third to fifth conditions, there was heat input to the stage 14 and the coolant path 14f was not inclined. Since, however, the flow velocity controller 72 was operated, all the temperatures at the measurement points M1 to M6 were found to be relatively low and substantially same.

As can be seen from the result of the experiment, by providing the stage 14 in which the coolant path 14f is formed to approach the top surface of the stage 14 (top surface of the base) as it goes from the inlet 14i toward the outlet 14e and by operating the flow velocity controller 72, the air bubbles within the coolant path 14f can be suppressed from staying in the vicinity of the outlet 14e. Therefore, the temperature of the entire surface of the stage 14 (entire top surface of the base) can be set to be uniform and low.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

I claim:

1. A substrate processing apparatus, comprising:
a chamber main body;
a stage, having a coolant path formed therein, provided in an internal space of the chamber main body and configured to support a substrate placed thereon;
a cooling device, provided at an outside of the chamber main body, comprising a cooling loop having a compressor, a condenser, a first expansion valve and an evaporator;
a local loop, provided at a position closer to the chamber main body than the cooling device is, comprising a receiver configured to store coolant therein, and an evaporator pressure regulating valve connected between the coolant path and the receiver;
a first valve connected between the condenser and the first expansion valve within the cooling loop;
a supply path having one end connected to the cooling loop between the first valve and the condenser and the other end connected to the receiver;
a second valve provided on the supply path;
a second expansion valve provided on the supply path between the second valve and the receiver; and
a discharge path having one end connected to the local loop at an output side of the evaporator pressure regulating valve and the other end connected to the cooling loop between the first expansion valve and the evaporator.

2. The substrate processing apparatus of claim 1,
wherein the substrate processing apparatus is configured as a plasma processing apparatus, and
the stage comprises a base in which the coolant path is formed and an electrostatic chuck provided on the base.

3. The substrate processing apparatus of claim 1,
wherein the stage has an inlet for the coolant into the coolant path and an outlet for the coolant from the coolant path,
the outlet is provided at a position closer to a periphery of the stage than the inlet is, and
the coolant path is inclined to approach a top surface of the stage as it goes from the inlet toward the outlet.

4. The substrate processing apparatus of claim 3,
wherein the outlet is provided within the coolant path, and disposed at a position higher than a lower wall surface confining the coolant path in a vertical direction.

5. A substrate processing apparatus, comprising:
a chamber main body;
a stage, having a coolant path formed therein, provided in an internal space of the chamber main body and configured to support a substrate placed thereon;
a cooling device, provided at an outside of the chamber main body, comprising a cooling loop having a compressor, a condenser, a first expansion valve and an evaporator;
a local loop, provided at a position closer to the chamber main body than the cooling device is, comprising a receiver configured to store coolant therein, and an evaporator pressure regulating valve connected between the coolant path and the receiver;
a supply path having one end connected to the cooling loop and the other end connected to the receiver;
a single three-way valve connected between the condenser, the first expansion valve and the supply path;
a second expansion valve provided on the supply path between the three-way valve and the receiver; and
a discharge path having one end connected to the local loop at an output side of the evaporator pressure regulating valve and the other end connected to the cooling loop between the first expansion valve and the evaporator.

6. The substrate processing apparatus of claim 5,
wherein the substrate processing apparatus is configured as a plasma processing apparatus, and
the stage comprises a base in which the coolant path is formed and an electrostatic chuck provided on the base.

7. The substrate processing apparatus of claim 5,
wherein the stage has an inlet for the coolant into the coolant path and an outlet for the coolant from the coolant path,
the outlet is provided at a position closer to a periphery of the stage than the inlet is, and
the coolant path is inclined to approach a top surface of the stage as it goes from the inlet toward the outlet.

8. The substrate processing apparatus of claim 7,
wherein the outlet is provided within the coolant path, and disposed at a position higher than a lower wall surface confining the coolant path in a vertical direction.

* * * * *

UNITED STATES PATENT AND TRADEMARK OFFICE
CERTIFICATE OF CORRECTION

PATENT NO. : 10,804,082 B2  
APPLICATION NO. : 16/043267  
DATED : October 13, 2020  
INVENTOR(S) : Yasuhiro Tobe Page 1 of 1

It is certified that error appears in the above-identified patent and that said Letters Patent is hereby corrected as shown below:

In the Specification

Column 7, Line 13, "141" should be -- 14f --.

Column 10, Line 48, "141" should be -- 14f --.

Signed and Sealed this  
First Day of June, 2021

Drew Hirshfeld  
*Performing the Functions and Duties of the*  
*Under Secretary of Commerce for Intellectual Property and*  
*Director of the United States Patent and Trademark Office*